(12) United States Patent
Hasper

(10) Patent No.: US 6,902,647 B2
(45) Date of Patent: Jun. 7, 2005

(54) METHOD OF PROCESSING SUBSTRATES WITH INTEGRATED WEIGHING STEPS

(75) Inventor: Albert Hasper, Meppel (NL)

(73) Assignee: Asm International N.V., Bilthoven (NL)

( * ) Notice: Subject to any disclaimer, the term of this patent is extended or adjusted under 35 U.S.C. 154(b) by 31 days.

(21) Appl. No.: 10/233,895

(22) Filed: Aug. 29, 2002

(65) Prior Publication Data

US 2004/0040659 A1 Mar. 4, 2004

(51) Int. Cl.$^7$ .................. C23F 1/00; H01L 21/306; C23C 16/00
(52) U.S. Cl. .............. 156/345.31; 156/345.24; 118/719
(58) Field of Search .............. 204/298.25, 298.26; 118/712, 719; 156/345.31, 345.32, 345.24; 356/237.2, 237.5; 438/14; 177/50; 427/372.2, 374.1–347.3

(56) References Cited

U.S. PATENT DOCUMENTS

| | | | |
|---|---|---|---|
| 4,590,103 A | * | 5/1986 | Ahne et al. ............ 427/387 |
| 4,676,637 A | | 6/1987 | Uto et al. |
| 4,719,125 A | | 1/1988 | Anello et al. |
| 4,836,905 A | | 6/1989 | Davis et al. |
| 4,886,975 A | | 12/1989 | Murakami et al. |
| 5,003,062 A | | 3/1991 | Yen |
| 5,024,570 A | | 6/1991 | Kiriseko et al. |
| 5,321,634 A | | 6/1994 | Obata et al. |
| 5,359,407 A | | 10/1994 | Suzuki et al. |
| 5,463,459 A | | 10/1995 | Morioka et al. |
| 5,539,514 A | | 7/1996 | Shishido et al. |
| 5,625,170 A | | 4/1997 | Poris |
| 5,872,632 A | | 2/1999 | Moore |
| 5,897,710 A | | 4/1999 | Sato et al. |
| 5,909,276 A | | 6/1999 | Kinney et al. |
| 5,940,175 A | | 8/1999 | Sun |
| 5,943,130 A | | 8/1999 | Bonin et al. |
| 5,963,315 A | | 10/1999 | Hiatt et al. |
| 5,965,679 A | | 10/1999 | Godschalx et al. |
| 6,084,664 A | | 7/2000 | Matsumoto et al. |
| 6,166,801 A | | 12/2000 | Dishon et al. |
| 6,194,234 B1 | * | 2/2001 | Huang et al. ............ 438/14 |
| 6,204,917 B1 | | 3/2001 | Smedt |
| 6,284,986 B1 | | 9/2001 | Dietze et al. |
| 6,286,685 B1 | * | 9/2001 | Kononchuk et al. ........ 209/2 |
| 6,309,831 B1 | | 10/2001 | Goldberg et al. |
| 6,544,338 B1 | * | 4/2003 | Batchelder et al. ....... 118/641 |

FOREIGN PATENT DOCUMENTS

| | | |
|---|---|---|
| JP | 63102225 | 5/1988 |
| WO | WO 01/80289 | 10/2001 |

* cited by examiner

Primary Examiner—Gregory Mills
Assistant Examiner—Karla Moore
(74) Attorney, Agent, or Firm—Knobbe, Martens, Olson & Bear LLP

(57) ABSTRACT

An apparatus for processing substrates comprises a substrate handling chamber, including a substrate handling robot for transferring substrates from cassettes into a substrate carrier. A processing chamber is provided adjacent to the handling chamber, including one or more furnaces adapted to process a plurality of the substrates supported in the carrier. A weighing device is accessible to the substrate handler. The weighing device is adapted to weigh the substrates before and after processing the substrates in the processing chamber. The illustrated process is a curing anneal for a low k polymer previously deposited on the substrates.

17 Claims, 3 Drawing Sheets

METHOD OF PROCESSING SUBSTRATES WITH INTEGRATED WEIGHING STEPS

FIELD OF THE INVENTION

The present invention relates to semiconductor processing tools and, more particularly, to semiconductor processing tools which allow the success of a process carried out on a substrate within the tool to be gauged without first removing the substrate from the tool.

BACKGROUND OF THE INVENTION

Semiconductor processing generally involves subjecting substrates, such as semiconductor wafers, to a series of processes to form layered structures on the substrates. During the course of such processing, it is often desirable to test the outcome of one process conducted on a substrate or batch of substrates prior to conducting another process on the same substrate or batch, in order to determine whether the first process was successful. If it was not successful, the substrates may be discarded or salvaged, if possible, prior to subjecting them to additional processes. Similarly, if it is determined that a process carried out on one batch of substrates was unsuccessful, it is usually desirable to identify and correct the problem prior to carrying out the same process on another batch of substrates so as not to risk having to discard additional substrates.

Various methods have been devised for testing whether certain processes have been successful. For example, in CVD processes, substrates have been weighed both prior to and after processing to determine whether, and by what amount, the weight of the substrates was increased as a result of the deposition process. If the deposition process was successful (i.e., a layer of material having a desired thickness was deposited on the substrates), the amount by which the weight of the substrates increased should fall within a predetermined range. If the change in weight of the substrates falls outside of the predetermined range, it can be assumed that the deposition process was unsuccessful.

One problem with such testing methods is that they are often performed outside of the tool in which the process is carried out on the substrates. The substrates must therefore be removed from the tool and transported to the testing device for testing. This typically requires that the substrates first be loaded into cassettes prior to being transported to the testing device. In the meantime, if processing is continued on another batch of substrates while the previous batch is being tested, there is a risk that additional substrates may have to be discarded when the process results on the previous batch are found to be unacceptable. Alternatively, if processing of the next batch of substrates is discontinued pending the results of the testing, the idle time adversely affects throughput.

SUMMARY OF THE INVENTION

Accordingly, a need exists for a semiconductor processing apparatus having an integrated weighing device that allows the success of a process carried out in the apparatus to be gauged without requiring that the substrates be removed from the apparatus.

In accordance with one aspect of the present invention, an apparatus for processing substrates is provided. The apparatus comprises a substrate handling chamber provided with an interface to receive a cassette. A substrate handler is located within the handling chamber, and is adapted to unload substrates to be processed from the cassette received at the interface and to reload processed substrates into the cassette. A reaction chamber is adjacent to the handling chamber for processing the substrates. A weighing device is accessible to the substrate handler. The weighing device is adapted to weigh the substrates before and after processing the substrates in the processing chamber.

In accordance with another aspect of the present invention, a method is provided for processing substrates in a processing tool that includes a substrate handling chamber, a processing chamber adjacent to the handling chamber and a weighing device. The method comprises loading a cassette into communication with the handling chamber, unloading substrates from the cassette, and loading the substrates into a substrate carrier. At least one of the substrates is weighed with the weighing device prior to loading the at least one substrate into the substrate carrier. The substrates are processed and the substrates are then moved out of the processing chamber. The at least one substrate is weighed with the weighing device after processing, and a change in weight of the at least one substrate resulting from the processing is determined.

In accordance with another aspect of the present invention, a method is provided for processing at least one substrate in a processing apparatus having an integrated weighing device. The method comprises weighing a substrate with the weighing device prior to processing and transferring the weighed substrate into a process chamber. The weighed substrate is annealed in the process chamber. The weighed and annealed substrate is then transferred out of the process chamber and re-weighed the weighing device after annealing, in order to determine an amount of weight lost by the substrate during annealing.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENT

Figure 1:
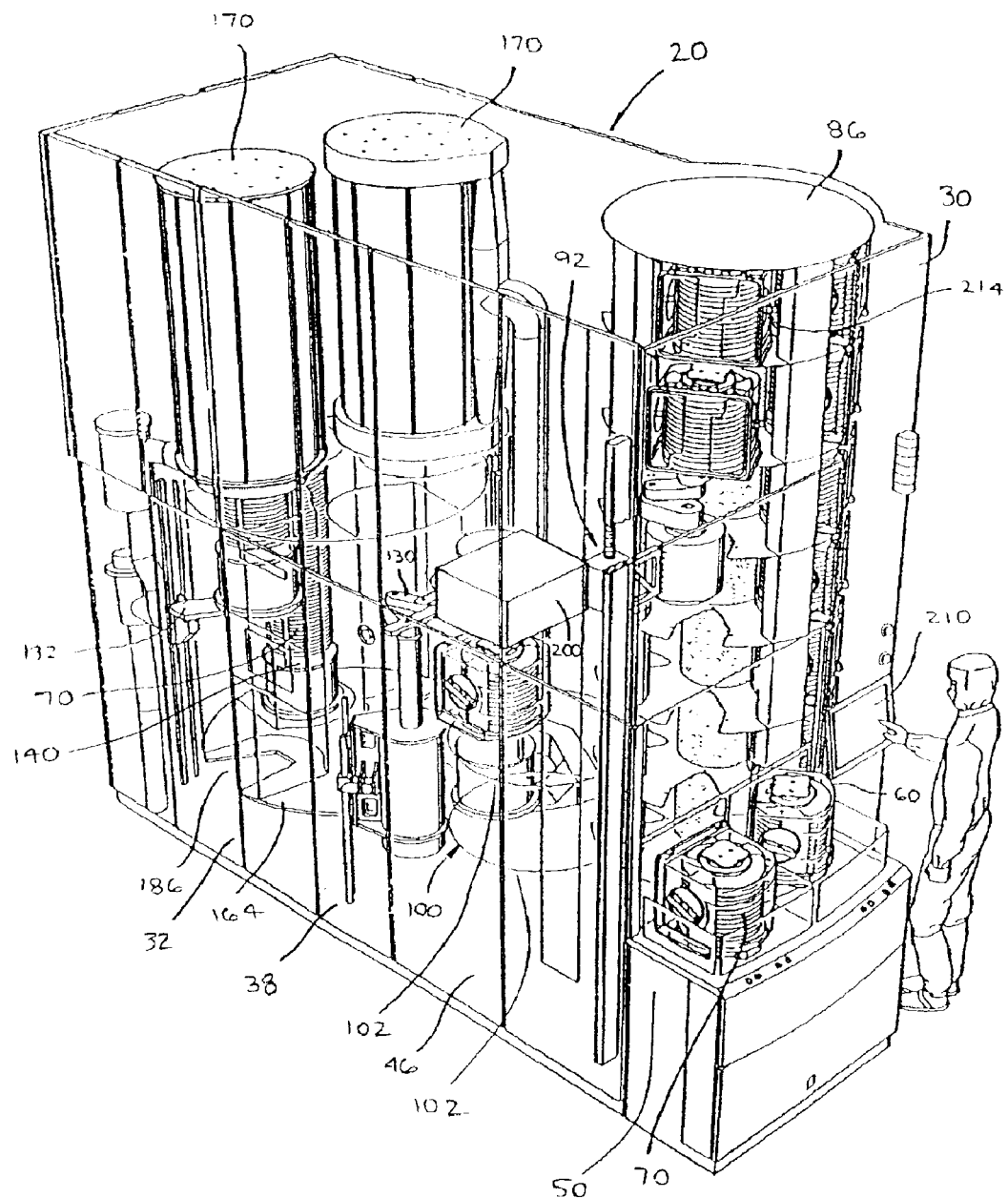
FIG. 1 is a perspective view of one embodiment of a substrate processing apparatus having features and advantages in accordance with the present invention.
Figure 2:
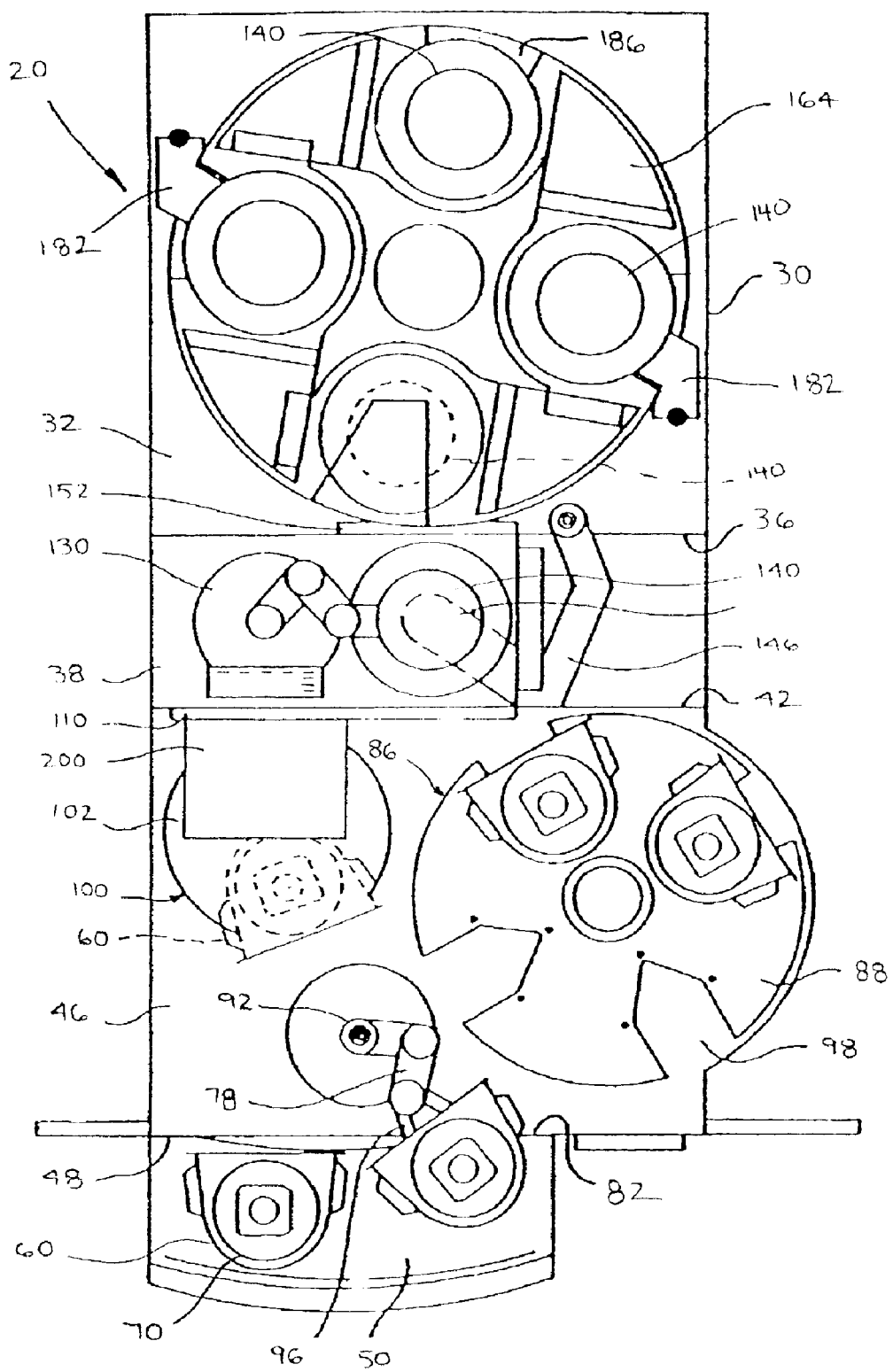
FIG. 2 is a schematic top plan view of the substrate processing apparatus of FIG. 1.
Figure 3:
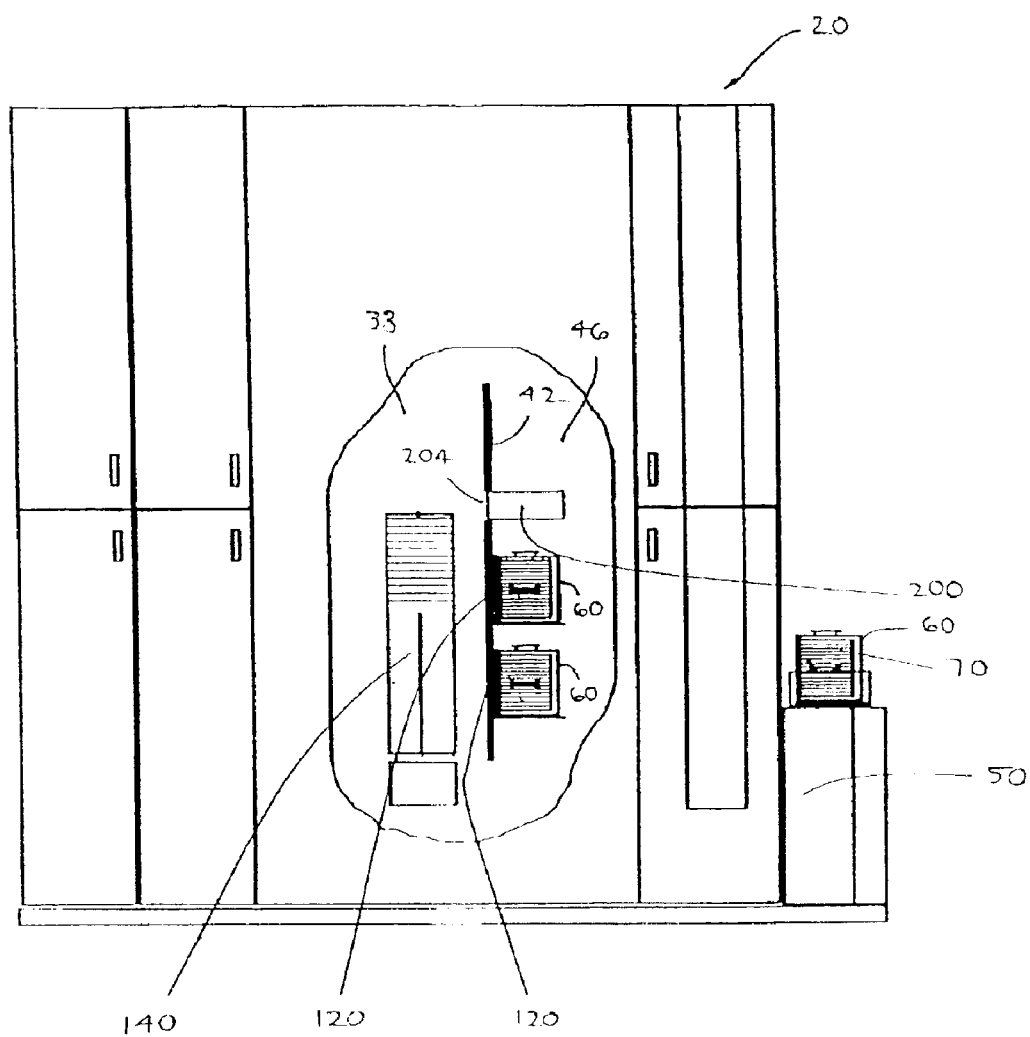
FIG. 3 is a schematic side elevational view of the substrate processing apparatus of FIG. 1, with a portion of the housing removed to show the location of the weighing device within the apparatus.

One exemplary embodiment of a substrate processing apparatus or tool 20 is illustrated in FIGS. 1–3. As illustrated in FIG. 1, the apparatus 20 includes a housing 30 installed in a so-called "clean room." A processing area or chamber 32 is defined at a back end within the housing by a first wall or partition 36, as illustrated in FIG. 2. A substrate handling chamber 38 is defined within the housing 30 between the first partition 36 and a second partition 42. A cassette transfer chamber 46 is defined within the housing 30 between the second partition 42 and a third partition 48. A front end part, which in the illustrated embodiment comprises a cassette loading station 50, is provided on the opposite side of the third partition 48 for moving a plurality of cassettes 60 containing substrates 70 into and out of the apparatus 20.

Preferably, the cassettes 60 are standard front-opening unified pods ("FOUPs"), which typically hold 25 substrates 70 and have doors that can be closed to provide sealed environments for the substrates 70 and opened to provide access to the substrates 70. A cassette handling device or robot 78 is provided in the cassette transfer chamber 46 to transport the cassettes 60 from the loading station 50 through a closable opening 82 to a cassette store 86. In the illustrated embodiment, the cassette store 86 comprises a number of vertically aligned rotary platforms 88 on which the cassettes 60 can be supported. The cassette handling device 78 is movable in a vertical direction by means of an elevator 92 so that the various platforms 88 of the cassette store 86 can be accessed by the cassette handling device 78.

The cassette handling device 78 includes a cassette end effector 96 which, in the embodiment shown, has dimensions slightly smaller than the dimensions of a plurality of cut-outs 98 provided in the rotary platforms 88. The cassette handling device 78 is operable to transport the cassettes 60 between the cassette loading station 50 and the store 86. The end effector 96 can be lowered or raised through the cut-outs 98 of the platforms 88 to lower the cassettes 60 onto, or raise the cassettes 60 off of, the platforms 88.

In the embodiment shown, a rotatable cassette transfer platform 100 is provided adjacent the partition 42 between the cassette transfer chamber 46 and the substrate handling chamber 38. The cassette transfer platform 100 of the illustrated embodiment includes two levels 102 (see FIG. 1) which can be rotated independently of one another. The cassette handling device 78 is adapted to transport the cassettes 60 between the store 86 and the cassette transfer platform 100. Alternatively, the cassette handling device 78 can transport the cassettes 60 directly between the cassette loading station 50 and the cassette transfer platform 100, bypassing the store 86. The transfer platform 100 can be rotated so that the doors of the cassettes 60 are positioned against an interface portion 110 of the partition 42. The interface portion 110 of the partition 42 preferably includes closeable openings 120 (see FIG. 3) through which the cassettes 60 can be accessed.

As illustrated in FIG. 2, a substrate handler or robot 130 is provided in the handling chamber 38. The substrate handler 130 is adapted to transfer substrates 70 between the cassettes 60 positioned against the interface portion 110 of the partition 42 and a substrate carrier 140, such as the illustrated vertical wafer boat. In the illustrated embodiment, the substrate carrier 140 is situated in the handling chamber 38 adjacent the substrate handler 130. Such an arrangement is found, for example, in the commerically available Advance 412™ vertical furnace tool, commerically available from ASM International N.V. of Bilthoven, The Netherlands. The substrate carrier 140 preferably holds greater than about 50 substrates, and in the illustrated embodiment holds 100 substrates 70. A transfer arm 146 is provided adjacent the substrate carrier 140. The transfer arm 146 is adapted to move the substrate carrier 140 between the handling chamber 38 and the processing chamber 32 through a closeable opening 152 provided in the partition 36. In other arrangements, the substrate handler 130 can load substrates into carriers 140 that are situated in the processing chamber 32. For example, in the Advance 400™ vertical funace tool from ASM International N.V. of Bilthoven, The Netherlands, the substrate carrier is positioned within the process chamber, and the handler loads the wafers onto the carrier through a door between the process chamber and the handling chamber.

A horizontal boat transfer mechanism, which in the illustrated embodiment comprises a turntable or carousel 164, is provided in the processing chamber 32. As illustrated in FIG. 1, a pair of reaction chambers or vertical furnaces 170 are provided above the carousel 164. The carousel 164 can be rotated to position substrate carriers 140 supported on the carousel 164 below the furnaces 170. A lift arm 182 is provided below each of the furnaces 170 to raise and lower the substrate carriers 140 into and out of the furnaces 170. Cut-outs 186 are provided in the carousel 164 for passage of the lift arm 182 as the substrate carriers 140 are lifted off of and lowered back onto the carousel 164.

The processing apparatus 20 also includes an integrated weighing device 200. Preferably, the weighing device 200 is accessible to the substrate handler 130. More preferably, the weighing device 200 is located adjacent to the substrate handling chamber 38. In the embodiment shown, the weighing device 200 is provided above the cassette transfer platform 100. The weighing device 200 abuts the partition 42 between the transfer chamber 46 and the handling chamber 38, and can be accessed from the handling chamber 38 through an opening 204 (see FIG. 3) in the partition 42, which is preferably provided with a door. The substrate handler 130 can thus easily access the weighing device 200 to insert and remove substrates 70 from the device 200. Although the weighing device 200 is located in the transfer cassette chamber 46 in the embodiment shown, those skilled in the art will appreciate that the optimum location for the weighing device 200 will depend on the particular design of the processing apparatus in which it is employed. The weighing device 200 may be of any suitable type, but in the illustrated embodiment comprises an electronically operated weighing device with a full range of at least 200 grams and preferably a full range of 1 kg. Preferably, the weighing device 200 has a resolution of 5 $\mu$g or better, and more preferably 1 $\mu$g or better.

To operate the processing apparatus 20, an operator, shown diagrammatically in FIG. 1, loads cassettes 60 onto the cassette loading station 50 of the apparatus 20. Processing instructions are input by the operator to a controller (not shown) of the apparatus 20 at a control panel 210. The cassette handling device 78 transports the cassettes 60 from the loading station 50 and places them in a number of storage compartments 214 provided in the store 86, which is rotated to present additional compartments 214 to be filled.

With reference again to FIG. 2, the cassette handling device 78 removes one of the cassettes 60 from the store 86 and places it on the cassette transfer platform 100. Alternatively, the cassette handling device 78 could transport a cassette 60 directly from the cassette loading station 50 to the transfer platform 100. The cassette transfer platform 100 is then rotated to position the door of the cassette 60 against the interface portion 110 of the partition 42. The substrate handler 130 removes the substrates 70 from the cassette 60 and loads them into a substrate carrier 140 located within reach of the handler 130.

Preferably, at least one of the substrates 70 from each batch (e.g., 100 substrates 70 in the illustrated embodiment) is weighed with the weighing device 200 prior to loading it into the substrate carrier 140. More preferably, at least three of the substrates 70 from each batch are weighed with the weighing device 200 prior to being loaded into the substrate carrier 140. The substrates 70 that have been weighed preferably are loaded into the substrate carrier 140 at separate locations. For example, if three of the substrates 70 are weighed, one of the substrates 70 preferably is loaded into the carrier 140 near the top of the carrier 140, the second near the middle of the carrier 140, and the third near the bottom of the carrier 140. The weight of each of the substrates 70 weighed is then recorded by the controller.

After the substrate carrier 140 has been loaded, in the illustrated embodiment the closure 152 in the partition 36 is opened. The transfer arm 146 moves the carrier 140 from the handling chamber 38 to the processing chamber 32 and places the carrier 140 onto the carousel 164 and the closure 152 is shut. In other arrangements, the carrier is already located within the processing chamber when being loaded. The carousel 164 is then rotated to move the carrier 140 into position beneath one of the furnaces 170. The lift arm 182 then lifts the carrier 140 into the furnace 170 for processing.

After processing, the lift arm 182 lowers the carrier 140 back onto the carousel 164. The processed substrates 70 may then be cooled on the carousel 164, as necessary, prior to removing the carrier 140 from the processing chamber 32. When the substrates 70 are sufficiently cool, the closure 152 in the partition 36 is again opened and the transfer arm 146 moves the carrier 140 back into the handling chamber 38.

The substrates 70 are unloaded from the carrier 140 by the substrate handler 130 and loaded into an empty cassette 60 positioned on the other side of the interface portion 110 of the partition 42. The substrates 70 that were weighed prior to processing are re-weighed with the weighing device 200 prior to being loaded into the cassette 60. The controller then compares the weight of each of the substrates 70 after processing to the weight of the same substrate 70 prior to processing to determine the amount of weight lost or gained by the substrate 70 during processing. If the change in weight of each of the substrates 70 weighed (or, if desired, the total change in weight of all of the substrates 70 weighed) falls within a predetermined "acceptable" range that has been pre-programmed into the controller, processing of a new batch of substrates 70 may begin. If the change in weight falls outside the acceptable range (i.e., the amount of weight gained or lost by one or more of the substrates 70 weighed, or the total amount of weight gained by all of the substrates 70 weighed, is either too great or too small), processing of the next batch of substrates 70 is suspended until the operator intervenes.

Because the weighing device 200 is integrated with the processing apparatus 20, it can be determined whether the process was unsuccessful based on the weight of the substrates immediately after completion of the process. There is no need to first reload the substrates 70 into cassettes 60, remove the cassettes 60 from the apparatus 20, and transport the cassettes 60 to another location for testing, by which time the next batch of substrates 70 would already be undergoing processing. If, after re-weighing the substrates 70, it is determined that the process was unsuccessful, processing of the next batch of substrates 70 can be immediately suspended until corrective measures have been taken. By measuring the weight change for multiple substrates at different locations within the carrier, the precision of tool diagnostics is improved. Furthermore, since the weighing device 200 is located within the housing 30 of the apparatus 20, it does not take up valuable additional floor space in the clean room.

In the illustrated processing apparatus 20, the process conducted in the processing chamber 32 is the annealing of spin-on polymer materials applied to substrates 70. Spin-on polymer materials are commonly used to form high quality insulating layers in integrated circuit devices. Such materials often have lower dielectric constants than conventional inorganic dielectric materials, such as silicon dioxide. The spin-on application process also generally results in planarization of the underlying substrate topography, which is desirable in many instances. Spin-on polymers are available from the Dow Chemical Company of Midland, Mich., U.S.A., under the trade name SiLK®. U.S. Pat. No. 4,719,125, issued Jan. 12, 1988 to Anello et al., U.S. Pat. No. 5,003,062, issued Mar. 26, 1991 to Yen, and U.S. Pat. No. 5,965,679, issued Oct. 12, 1999 to Godschalx et al., provide background information relating to spin-on polymer processes, and are hereby incorporated by reference herein.

The application of spin-on polymer materials typically involves depositing the material in a solvent solution onto a substrate 70 and spinning the substrate 70 at high speeds to distribute a thin film of the material over the surface of the substrate 70. The substrate 70 then undergoes a preliminary baking process, typically at a temperature between about 100° C. and 200° C., to evaporate the solvent from the film.

After the solvent has been evaporated from the film, the substrate 70 undergoes an annealing process to cure and stabilize the polymer film. The annealing process can advantageously be carried out in the apparatus 20 of the illustrated embodiment. Substrates 70 which have previously undergone the preliminary baking process are loaded into the cassettes 60 which, in turn, are loaded into the loading station 50 of the apparatus 20. The cassettes 60 are moved through the cassette transfer chamber 46 in the manner described above. The substrate handler 130 removes the substrates 70 from the cassettes 60 and loads them into a substrate carrier 140. One or more of the substrates 70 are weighed, as described above, prior to loading them into the carrier 140, and the weight of each of the substrates 70 is recorded by the controller. In the illustrated embodiment, the loaded carrier 140 is then moved into the processing chamber 32, rotated into position beneath one of the furnaces 170, and lifted by one of the lift arms 182 into the overlying vertical furnace 170 to begin the annealing process.

The annealing process preferably is carried out in a nitrogen atmosphere at a temperature between about 100° C. and 600° C., and more preferably between about 150° C. and 350° C. During the annealing process, cross-linking of the polymer material occurs and a stable, high quality insulating layer is formed. As the polymer material is cross-linked, ligands are released from the polymers. As a result, the weight of the material, and thus the overall weight of each substrate 70 (including the layer of polymer material) is decreased. In addition, some remaining trace amounts of the solvent may be evaporated from the material during the annealing process, thereby further reducing the weight of the substrates 70.

After the annealing process is completed, the carrier 140 is lowered out of the furnace 170 and moved back into the handling chamber 38. The substrates 70 are then unloaded from the carrier 140 by the substrate handler 130 and loaded into empty cassettes 60 positioned on the other side of the interface portion 110 of the partition 42. The substrates 70 that were weighed prior to processing are re-weighed prior to being loaded into the cassettes 60. The controller then compares the weight of each of the substrates 70 after processing to the weight of the same substrate 70 prior to processing, as described above, to determine the amount of weight lost by each of the substrates 70 during the annealing process.

It is possible to determine a range within which the amount of weight lost by each of the substrates 70 should fall if the annealing process is successful. For example, during a successful curing anneal of a spin-on polymer material, typically between about 0.5% and 5% of its weight is lost. The applied film thickness for such a spin-on polymer material is in the range of 0.1 $\mu$m to 1.0 $\mu$m whereas the density is about 1.0 g/cm$^3$. For a standard 300 mm wafer, having a surface area of 707 cm$^2$, this results in a minimum weight change of 35 $\mu$gram and a maximum weight change of 3500 $\mu$gram. Note that the weight of one monolayer of water atoms on a 300 mm wafer, assuming a film thickness of 0.3 nm, is 707*0.3*10$^{-7}$=21 $\mu$g. Furthermore, for comparison the weight of a 300 mm wafer having a thickness of 875 $\mu$m and a density of 2.2 g/cm$^3$ is 136 grams. For a 200 mm wafer these numbers are scaled down in ratio to the surface area of the wafer and its thickness.

If the amount of weight lost by one or more of the substrates 70 during the annealing process falls outside of the predetermined range, it may be assumed that the annealing process was unsuccessful and that a problem exists. For example, if the amount of weight lost by one or more of the substrates 70 during the annealing process is too low, it may be that there was insufficient cross-linking of the polymer material. If the amount of weight lost by one or more of the substrates 70 during the annealing process is too high, it may be that the polymer has been oxidized due to the presence of undesired amounts oxygen, delamination of the polymer film or other causes. In either case, if the change in weight of each of the substrates 70 falls outside of the predetermined range, processing of the next batch of substrates 70 is suspended until an operator intervenes. If the change in weight of each of the substrates 70 falls inside the predetermined range, processing of next batch may continue.

While the operation of the processing apparatus 20 has been described in the context of a spin-on polymer annealing process, it will be understood by those skilled in the art that the apparatus 20 can also be used in other types of processes. In general, the processing apparatus 20 can advantageously be used for any process in which the success of the process can be gauged by the resulting change in weight of the substrates 70. Examples of such processes include anneal processes and cure processes, such as anneal of PSG and BPSG films up to 900° C., the deposition of films by CVD or other techniques, the removal of films by etching techniques and the thinning of substrates by grinding.

Accordingly, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. It is further contemplated that various combinations and sub-combinations of the specific features and aspects of the embodiments may be made and still fall within the scope of the invention. Accordingly, it is intended that the scope of the present invention herein disclosed should not be limited by the particular disclosed embodiments described above, but should be determined only by a fair reading of the claims that follow.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

I claim:

1. A method of processing substrates in a processing tool comprising a substrate handling chamber, a processing chamber adjacent to the handling chamber and a weighing device, the method comprising:

loading a cassette into communication with the handling chamber;

unloading substrates from the cassette;

loading the substrates into a substrate carrier;

weighing at least one of the substrates with the weighing device prior to loading the at least one substrate into the substrate carrier;

moving the substrates into the processing chamber;

processing the substrates on the substrate carrier within the processing chamber;

moving the substrates out of the processing chamber after processing;

re-weighing the at least one substrate with the weighing device after processing; and determining a change in weight of the at least one substrate resulting from the processing.

2. The method of claim 1, further comprising determining whether the change in weight of the at least one substrate falls within a predetermined acceptable range.

3. The method of claim 2, further comprising processing additional substrates in the processing chamber if the change in weight of the at least one substrate falls within the acceptable range, and discontinuing processing in the processing chamber if the change in weight of the at least one substrate does not fall within the acceptable range.

4. The method of claim 1, wherein at least three of the substrates are weighed prior to loading the at least three substrates into the substrate carrier and re-weighed after processing.

5. The method of claim 4, wherein one of the at least three substrates is loaded into the substrate carrier near a top of the carrier, another is loaded into the carrier near a middle of the carrier, and another is loaded into the carrier near a bottom of the carrier.

6. The method of claim 1, wherein the change in weight of the at least one substrate is a reduction in weight.

7. The method of claim 6, wherein the processing comprises curing a low k polymer material applied to the substrates.

8. The method of claim 7, wherein each wafer loses between about 35 $\mu$g and 3500 $\mu$g when the processing is operating correctly.

9. The method of claim 1, wherein moving the substrate into the processing chamber comprises moving the substrate carrier into a vertical furnace located within the processing chamber.

10. The method of claim 9, wherein moving the substrates into the processing chamber further comprises moving the substrate carrier from the substrate handling chamber into the processing chamber prior to moving the substrate carrier into the vertical furnace.

11. A method or processing at least one substrate in a processing apparatus having an integrated weighing device, the method comprising:

applying a polymer material to the substrate;

performing a preliminary baking process on the substrate after applying the polymer material and prior to weighing the substrate, the preliminary baking process driving off a solvent material present in the polymer material;

weighing a substrate with the weighing device prior to processing;

transferring the weighed substrate into a process chamber;

annealing the weighed substrate in the process chamber;

transferring the weighed and annealed substrate out of the process chamber; and re-weighing the substrate with the weighing device after the annealing to determine an amount of weight lost by the substrate during the annealing.

12. The method of claim 11, wherein the annealing comprises cross-linking the polymer material.

13. The method of claim 12, wherein the annealing further comprises driving off residual amounts of the solvent material.

14. The method of claim 13, wherein the annealing the weighed substrate is performed at a temperature between about 100° C. and 900° C.

15. The method of claim 13, wherein the annealing the weighed substrate is performed at a temperature between about 150° C. and 350° C.

16. The method of claim 13, wherein the annealing the weighed substrate is performed in a nitrogen atmosphere.

17. A method of processing at least one substrate in a processing apparatus having an integrated weighing device, the method comprising:

weighing a substrate with the weighing device prior to processing;

transferring the weighed substrate into a process chamber;

annealing the weighed substrate in the process chamber, wherein annealing comprises losing between about 35 $\mu$g and 3500 $\mu$g when annealing is operating correctly;

transferring the weighed and annealed substrate out of the process chamber;

re-weighing the substrate with the weighing device after the annealing to determine an amount of weight lost by the substrate during the annealing; and determining whether to process another substrate based on the amount of weight lost by the substrate during the annealing.

* * * * *

UNITED STATES PATENT AND TRADEMARK OFFICE
CERTIFICATE OF CORRECTION

PATENT NO. : 6,902,647 B2
DATED : June 7, 2005
INVENTOR(S) : Albert Hasper and Philippe George M. Bajolet It is certified that error appears in the above-identified patent and that said Letters Patent is hereby corrected as shown below:

<u>Title page,</u>
Item [75], Inventor, and "(NL)" insert -- ; Philippe George M. Bajolet, Wavre, Belgium --.

Signed and Sealed this

Eleventh Day of April, 2006

JON W. DUDAS
*Director of the United States Patent and Trademark Office*